United States Patent [19]
Socha

[11] Patent Number: 5,242,097
[45] Date of Patent: Sep. 7, 1993

[54] INTEGRATED PREFORMS

[75] Inventor: Paul A. Socha, Whitesboro, N.Y.

[73] Assignee: Indium Corporation of America, New Hartford, N.Y.

[21] Appl. No.: 904,828

[22] Filed: Jun. 26, 1992

[51] Int. Cl.⁵ ........................................... B23K 35/14
[52] U.S. Cl. .................... 228/56.3; 228/246; 228/255
[58] Field of Search .............. 228/56.3, 246, 247, 228/180.1, 255

[56] References Cited

U.S. PATENT DOCUMENTS

| | | | |
|---|---|---|---|
| 3,750,265 | 8/1973 | Cushman | 228/56.3 |
| 3,932,934 | 1/1976 | Lynch et al. | 228/255 |
| 4,050,621 | 9/1977 | Bouley | 228/247 |
| 4,216,350 | 8/1980 | Reid | 228/246 |
| 4,557,411 | 10/1985 | Farquharson et al. | 228/56.3 |
| 5,029,748 | 7/1991 | Lauterbach et al. | 228/255 |

Primary Examiner—Samuel M. Heinrich
Assistant Examiner—Jeffrey T. Knapp
Attorney, Agent, or Firm—Wall and Roehrig

[57] ABSTRACT

A solder preform containing a series of islands that are joined together in a matrix by bridging bands. Each band has a reduced cross-sectional area in its midregion. In one form of this invention, at least some of the islands contain pin receiving holes formed therein and solder tabs that are arranged to frictionally engage a pin that is passed into the hole to prevent the preform from being misaligned or dislodged from the pins and which at the time of bonding, prewets the pins to promote flowing of solder to the pins from the islands to form a superior solder joint.

8 Claims, 2 Drawing Sheets

INTEGRATED PREFORMS

BACKGROUND OF THE INVENTION

This invention relates to solder or pure metal preforms for use in joining one object to another, and more particularly to an integrated preform for joining electronic elements to connectors, circuit boards, terminals and other elements.

The art of soldering is old, and the techniques that have been developed over the years are as varied as the types of apparatus which must be soldered. Increasingly, particularly in the field of electronics, many multiple element structures must be rapidly and automatically joined together without disturbing parts alignment.

Various solder preforms have been suggested such as those in U.S. Pat. No. 4,050,621 to Bouley and U.S. Pat. No. 4,557,411 to Farquharson. In these patents, clusters are shown in which a series of solder islands are joined together by narrow bridging bands of solder material in a pattern to match a similar pattern on a circuit board or the like. In one embodiment, the solder islands are washer-type elements having holes that align with similar holes in the circuit board and component pins are passed through the aligned holes. The assembly is heated to a desired temperature to melt the solder. The solder in the bridging bands flows into the adjacent washers through means of a wicking action and a solder joint is formed between the component pins and the circuit board.

As suggested in the noted '411 patent, this preform matrix works well for certain applications. However, in other applications, the bridging bands may not be completely severed after melting, thereby causing defects in the finished product. In the electronics art today, very complicated and expensive components, circuit boards and other devices are fastened one to the other. When soldered, these components cannot be readily separated without causing considerable damage to the part and the part must be scraped or reworked. As is well known, scrapping or reworking of parts is generally expensive.

Processes wherein unbonded solder preforms are installed upon a circuit board or the like sometimes require extensive handling of the assembly before the final bonding operation is completed. The preform thus can become misaligned or dislodged from the assembly during the various handling operations.

OBJECTS AND SUMMARY OF THE INVENTION

Accordingly, it is an object of the present invention to improve preforms to overcome limitations found in the prior art.

It is another object of the present invention to provide a solder preform that once applied about the terminals or pins of components to be soldered will not become easily dislodged when the assembly is handled prior to the solder bonding operation.

It is another object of the present invention to provide an integrated solder preform in which the individual bridging bands cojoining solder islands positively and reliably separate in the midregion of the band so that the separated halves wick into the adjacent solder islands in a positive, and uniform fashion.

It is another object of the present invention to provide an improved solder preform which produces superior solder connections rapidly and with less bridging defects than heretofore possible.

These and other objects of the present invention are attained by an integrated preform having a plurality of solder islands that are cojoined by bridging bands formed of the same material as the islands. Each bridging band has a reduced cross-sectional area in its midregion which permits uniform and clean separation of the bands when the preform is heated to a predetermined temperature. In one embodiment of the invention, at least some of the solder islands are washer shaped elements having holes for receiving a component pin. Solder tabs are provided on the washer shaped islands which frictionally engage pins inserted therein to prevent the preform from slipping or becoming dislodged from the assembly prior to final bonding. The tabs melt rapidly during the bonding process and thus the flow of solder to the pins is promoted.

BRIEF DESCRIPTION OF THE DRAWINGS

For a better understanding of these and other objects of the present invention, reference is made to the detailed description of the invention which is to be read in conjunction with the following drawings, wherein.

DETAILED DESCRIPTION OF THE INVENTION

Figure 1:
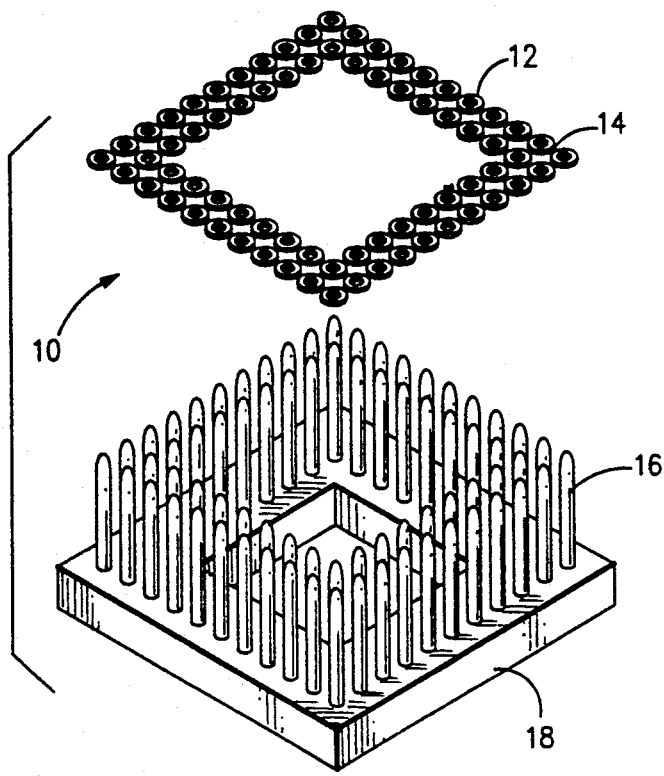
FIG. 1 is an exploded perspective view of a solder preform and a component with which the preform is used to solder it to a board.
Figure 2:
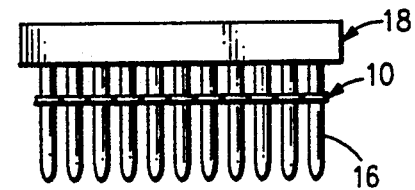
FIG. 2 is a side elevation of the preform applied to the component of FIG. 1 showing the preform held in position.

Referring initially to FIG. 1, there is shown a pin unit 18 containing a plurality of pins 16 aligned in a desired pattern. A suitable solder preform generally referenced 10 embodying the teachings of the present invention is shown situated over the pin array. The preform contains a plurality of washer shaped solder islands 12—12 which are equal in number to the number of pins in the pin array. The washer shaped islands are held in a matrix by means of connecting bridging bands 14—14 so that the holes in the islands match the pin array pattern. The pins are inserted into the preform as illustrated in FIG. 2 and then into receiving holes 40 in a circuit board 42 (FIG. 4) to place the preform islands in contact with electrical elements on the board.

Preferably, the integrated preform is fabricated from a solid sheet of solder using an etching technique to form the desired pattern. Although the main embodiment of the invention employs washer shaped solder islands, the size and shape can vary depending on the needs of a particular bonding application.

Figure 3:
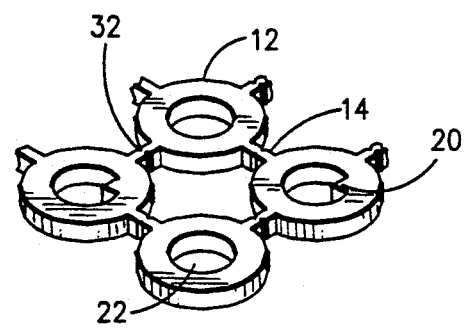
FIG. 3 is an enlarged fragmentary detail perspective of a preform of the present invention.
Figure 4:
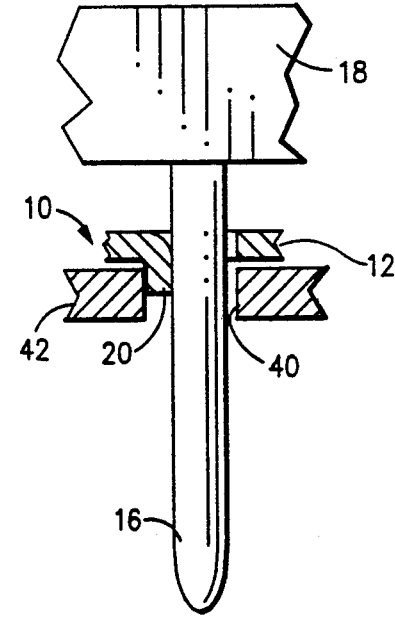
FIG. 4 is an enlarged side elevation partially in section showing a retaining ear frictionally engaging a pin.

As illustrated in FIGS. 3 and 4, certain selected solder washers 12 are equipped with tabs 20—20 that extend radially into the hole area 22 of the washer so that the tabs will frictionally engage pins that are passed into the selected holes. In this embodiment each tab is a V-shaped member that runs along substantially the entire depth of the hole. The tabs are formed of solder, which is relatively soft and the tabs are thus deflected by the harder pin in the direction of pin insertion. This, in turn, forces the tabs outwardly beyond the lower margin of the hole as illustrated in FIG. 4.

The tabs do not have to be V-shaped and can take any suitable form that will permit the tabs to frictionally contact pins inserted into the washer and be deflected downwardly in the direction of insertion to lock the preform against the pins. The more tabs that are employed, the stronger the prebonding force that will be exerted upon the pin array and the less likely the preform is to become dislodged as the assembly is being handled during processing.

With further reference to FIG. 4, tab 20 on preform 10 is shown deflected downwardly by pin 16 that has been inserted through the washer-like solder island into hole 40 of circuit board 42. The solder washer is placed in electrical contact with a selected electrical component on the board. At the same time, the deflected portion of the pin is passed into the receiving hole 40 in the circuit board. Upon heating of the preform to the solder melting temperature the comparatively smaller tab will melt before the washer and the tab solder will flow to prewet the pin and the wall of the circuit board opening. This prewetting promotes the flow of solder from the washer around the pin within the hole region. At the same time, the bridges connecting the solder washers melt causing the bridges to separate and the bridge solder is then wicked rapidly into the washers to replenish solder that is wicked into the circuit board hole region thus creating a superior solder joint.

As can be seen, the tabs provide a two-fold advantage in the use of integrated preforms. First, they provide locking contact against pins passed through the solder washers thus insuring the preform will not become misaligned or dislodged during prebonding handling. Secondly, during bonding the tabs melt to provide prewetting of the pins and thus enhance the flow of solder into the circuit board hole region.

Figure 5:
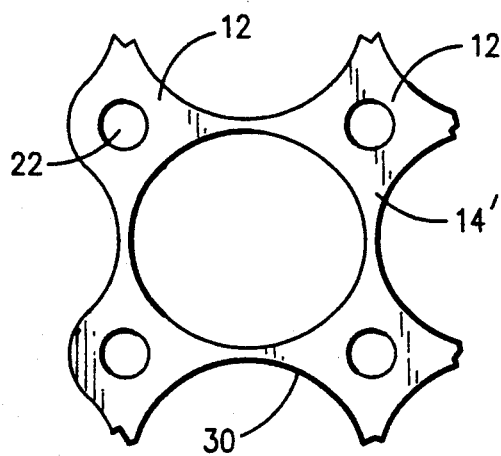
FIG. 5 is a plan view of another embodiment of the present preform invention.

The separation of bridging bands in existing preforms typically takes place in an uncontrolled manner when the preform is heated. Separation may take place so that a predominance of the bridge solder is wicked to one solder washer or island, thus creating an imbalance in the amount of solder provided by the bridges to the washers or islands. To avoid this problem, the bridges of the present invention are contoured so that separation takes place in the midregion of each bridge. FIG. 5 illustrates a series of solder islands depicted at 12 that are cojoined bridges 14' having arcuate shaped side walls 30. Each solder island also contains a pin receiving hole 22. The walls of the bridges come together uniformly as the bridges move outwardly from the solder islands so that the narrowest section of each bridge occurs at the midregion of each bridge. Due to this construction, the cross-sectional area of each bridge at the midregion is considerably less than in the region where the bridge half sections are joined to the islands. When heated, the bridges first separate at the narrow midregion and the separate half-sections are rapidly wicked into the adjacent solder islands. The amount of solder in the half sections may be controlled to provide a desired amount of solder to the adjacent solder islands.

Figure 6:
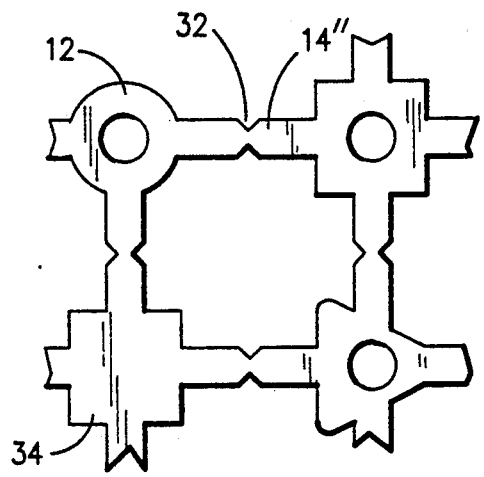
FIG. 6 is a view similar to FIG. 5 of a still further embodiment of the present invention.

FIG. 6 illustrates another embodiment of the invention in which the bridges 14" are generally rectangular in cross-section. Each bridge contains at least one transversal notch 32 which provides a reduced solder area at the midregion of each bridge. As can be seen, the bands will all separate cleanly and uniformly in the notch region and wick uniformly into the adjacent solder island when the preform is heated to the solder melt temperature. As noted, the geometry of the preform solder islands do not have to be uniform and the islands as illustrated in FIG. 6 can take almost any desired shape, as for example, square island 34. Similarly, the islands may or may not contain pin receiving holes.

Figure 7:
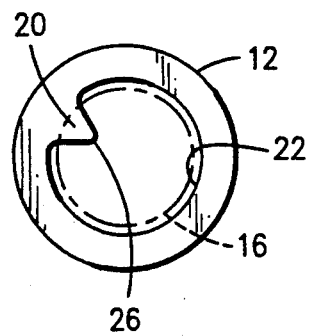
FIG. 7 is an enlarged detail plan view of a washer and retaining ear in accordance with the present invention.

FIG. 7 illustrates in greater detail a triangular shaped tab located in the receiving hole 22 of a bonding pad 12. The outline of a pin conductor 16 is shown in phantom outline. As can be seen, the tip 26 of the tab extends inwardly into the region occupied by pin so that good frictional contact is obtained when the pin is inserted into the receiving hole.

While this invention has been explained with reference to the structure disclosed herein, it is not confined to the details set forth and this application is intended to cover any modifications and changes as may come within the scope of the following claims:

What is claimed is:

1. An integrated preform employed in a process for bonding objects, said preform including:
   a series of discrete solder islands disposed in a desired matrix, a plurality of said islands containing a hole for receiving a pin therein,
   bridging bands for joining each of the islands in the matrix, said bridging bands being formed of the same solder material as said islands,
   a number of said solder islands containing a hole and further including a tab for frictionally contacting a pin passing into said hole to lock the preform to said pin, and
   each tab being formed of said solder and being located inside said hole and being disposed axially along substantially the entire length of the side wall thereof, said tab further extending radially into said hole to partially obscure the hole opening.

2. The preform of claim 1 wherein the islands and said tabs are formed of a solder material whereby the tab melts when heated to wet the surface of a connector inserted into said islands containing a hole.

3. The preform of claim 1 wherein the islands have varying geometries.

4. The preform of claim 1 wherein the cross-sectional area of each bridging band id greater in the edge region where it joins an island than in the midregion of the band so that equal amounts of solder flow into each connected island.

5. An integrated solder preform for use in securing an array of pins to a circuit board that includes
   a series of discrete solder islands disposed in a desired matrix, and a plurality of said islands having pin receiving holes formed therein,
   bridging bands for joining each island in the matrix to at least one other island,
   each bridging band being formed of the same solder material as the islands, the cross-section area in each band midregion being less than the cross-section area in the band edge regions where the band is joined to an adjacent island,
   whereby the bands separate evenly in the midregion into two equal half sections and equal amounts of solder in the half-sections flow into adjacent islands when the matrix is heated to a predetermined temperature and, a triangular-shaped tab means formed of solder being located inside the opening of a number of pin receiving holes, each tab means extending radially inwardly from the side wall of said opening to partially obscure the opening so as to frictionally engage a pin that is passed into said opening.

6. The preform of claim 5 wherein the cross sectional area of each half-section increases uniformly from the midregion toward the edge region.

7. The preform of claim 5 wherein each bridging band contains a notch in its midregion for reducing the cross-sectional area of the band in said midregion.

8. The preform of claim 1 wherein each tab is formed of the same solder material as said bridge bands said islands.

* * * * *